(12) United States Patent
Wang et al.

(10) Patent No.: US 11,387,683 B2
(45) Date of Patent: *Jul. 12, 2022

(54) COMPOSITE INTEGRATED CIRCUITS AND METHODS FOR WIRELESS INTERACTIONS THEREWITH

(71) Applicant: Taiwan Semiconductor Manufacturing Company, Ltd., Hsinchu (TW)

(72) Inventors: Min-Jer Wang, Hsinchu (TW); Ching-Nen Peng, Hsinchu (TW); Chewn-Pu Jou, Hsinchu (TW); Feng Wei Kuo, Zhudong Township (TW); Hao Chen, New Taipei (TW); Hung-Chih Lin, New Taipei (TW); Huan-Neng Chen, Taichung (TW); Kuang-Kai Yen, Kaohsiung (TW); Ming-Chieh Liu, Longtan Township (TW); Tsung-Hsiung Lee, New Taipei (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 17/015,602

(22) Filed: Sep. 9, 2020

(65) Prior Publication Data

US 2021/0013748 A1  Jan. 14, 2021

Related U.S. Application Data

(63) Continuation of application No. 16/220,514, filed on Dec. 14, 2018, now Pat. No. 10,790,707, which is a
(Continued)

(51) Int. Cl.
*G01R 31/28* (2006.01)
*H02J 50/40* (2016.01)
(Continued)

(52) U.S. Cl.
CPC .......... *H02J 50/40* (2016.02); *G01R 31/2856* (2013.01); *G01R 31/2884* (2013.01);
(Continued)

(58) Field of Classification Search
CPC .. H02J 50/40; H02J 50/80; H02J 50/10; H02J 50/20; G06F 30/39; G01R 31/2856;
(Continued)

(56) References Cited

U.S. PATENT DOCUMENTS 6,480,699 B1  11/2002 Lovoi
6,954,236 B1  10/2005 Russell et al.
(Continued)

FOREIGN PATENT DOCUMENTS

CN  102201067  9/2011
JP  200530877  2/2005
TW  200809930  2/2008

OTHER PUBLICATIONS

Office Action issued in Chinese Patent Application No. 201410507437.4 dated Mar. 24, 2017.
(Continued)

*Primary Examiner* — Christine T. Tu
(74) *Attorney, Agent, or Firm* — Haynes and Boone, LLP

(57) ABSTRACT

An integrated circuit (IC) includes a first circuit layer that includes a first wireless power transfer (WPT) device, a first chip electrically connected to the first circuit layer, and a first tracking circuit disposed in the first chip. The first WPT device may be configured to extract energy from an electromagnetic signal and provide an output voltage. The first tracking circuit may be powered by the output voltage of the
(Continued)

first WPT device and may output tracking data in response to an instruction extracted from the electromagnetic signal.

20 Claims, 10 Drawing Sheets

Related U.S. Application Data continuation of application No. 15/589,435, filed on May 8, 2017, now Pat. No. 10,164,480, which is a continuation of application No. 14/804,319, filed on Jul. 20, 2015, now Pat. No. 9,653,927, which is a continuation-in-part of application No. 13/572,533, filed on Aug. 10, 2012, now Pat. No. 9,086,452.

(51) Int. Cl.

| | |
|---|---|
| *H01L 25/065* | (2006.01) |
| *H01L 23/538* | (2006.01) |
| *H02J 50/10* | (2016.01) |
| *H02J 50/80* | (2016.01) |
| *G01R 31/302* | (2006.01) |
| *H01L 23/544* | (2006.01) |
| *G06F 30/39* | (2020.01) |
| *H02J 50/20* | (2016.01) |
| *H01L 23/00* | (2006.01) |

(52) U.S. Cl.
CPC ..... *G01R 31/2889* (2013.01); *G01R 31/3025* (2013.01); *G06F 30/39* (2020.01); *H01L 23/538* (2013.01); *H01L 23/544* (2013.01); *H01L 25/0652* (2013.01); *H02J 50/10* (2016.02); *H02J 50/20* (2016.02); *H02J 50/80* (2016.02); *H01L 24/16* (2013.01); *H01L 25/0655* (2013.01); *H01L 25/0657* (2013.01); *H01L 2223/54446* (2013.01); *H01L 2224/1403* (2013.01); *H01L 2224/14181* (2013.01); *H01L 2224/16145* (2013.01); *H01L 2224/16148* (2013.01); *H01L 2224/16225* (2013.01); *H01L 2224/16238* (2013.01); *H01L 2224/81193* (2013.01); *H01L 2224/94* (2013.01); *H01L 2225/06513* (2013.01); *H01L 2225/06517* (2013.01); *H01L 2225/06565* (2013.01); *H01L 2225/06596* (2013.01); *H01L 2924/15192* (2013.01); *H01L 2924/15311* (2013.01)

(58) Field of Classification Search
CPC ............ G01R 31/2884; G01R 31/2889; G01R 31/3025; H01L 23/538; H01L 23/544; H01L 25/0652; H01L 25/0655; H01L 25/0657; H01L 24/16; H01L 2223/54446; H01L 2224/1403; H01L 2224/14181; H01L 2224/16145; H01L 2224/16148; H01L 2224/16225; H01L 2224/16238; H01L 2224/81193; H01L 2224/94; H01L 2225/06513; H01L 2225/06517; H01L 2225/06565; H01L 2225/06596; H01L 2924/15192; H01L 2924/15311; H01L 2224/81

See application file for complete search history.

(56) References Cited

U.S. PATENT DOCUMENTS

| | | | |
|---|---|---|---|
| 8,596,544 B2 | 12/2013 | Kang | |
| 8,698,300 B2 | 4/2014 | Ko | |
| 8,744,349 B2 | 6/2014 | Kuroda | |
| 9,086,452 B2 | 7/2015 | Wang et al. | |
| 9,460,848 B2 | 10/2016 | Lee et al. | |
| 9,653,927 B2 | 5/2017 | Wang et al. | |
| 9,773,754 B2 | 9/2017 | Fu | |
| 2008/0044257 A1 | 2/2008 | England et al. | |
| 2008/0142942 A1 | 6/2008 | Du et al. | |
| 2008/0210762 A1* | 9/2008 | Osada | G06K 19/07783 |
| | | | 235/492 |
| 2011/0084314 A1 | 4/2011 | Or-Bach et al. | |
| 2011/0127845 A1 | 6/2011 | Walley | |
| 2012/0263244 A1 | 10/2012 | Kyles | |
| 2013/0002034 A1 | 1/2013 | Onizuka et al. | |
| 2013/0119535 A1* | 5/2013 | Joshi | H01L 23/3677 |
| | | | 257/737 |
| 2013/0257168 A1 | 10/2013 | Singh | |
| 2014/0043148 A1 | 2/2014 | Wang et al. | |
| 2014/0294103 A1 | 10/2014 | Mese | |
| 2015/0323589 A1 | 11/2015 | Wang et al. | |
| 2017/0133134 A1* | 5/2017 | Pohl | H02J 50/10 |
| 2017/0242071 A1 | 8/2017 | Wang et al. | |
| 2018/0069433 A1 | 3/2018 | Lin et al. | |

OTHER PUBLICATIONS

Office Action issued in Taiwan Patent Application No. 101138983 dated Jun. 17, 2014.

\* cited by examiner

COMPOSITE INTEGRATED CIRCUITS AND METHODS FOR WIRELESS INTERACTIONS THEREWITH

PRIORITY CLAIM

This application is a continuation of U.S. patent application Ser. No. 16/220,514 filed on Dec. 14, 2018, which is a continuation of U.S. application Ser. No. 15/589,435 filed on May 8, 2017, now U.S. Pat. No. 10,164,480, issued Dec. 25, 2018, which is a continuation of U.S. patent application Ser. No. 14/804,319 filed on Jul. 20, 2015, now U.S. Pat. No. 9,653,927, issued May 16, 2017, which is a continuation-in-part of U.S. application Ser. No. 13/572,533, filed Aug. 10, 2012, now U.S. Pat. No. 9,086,452, issued Jul. 21, 2015, each of which is incorporated herein by reference in its entirety.

FIELD

The present disclosure relates to a three-dimensional integrated circuit (3DIC) and a method for an information access of the 3DIC, including composite integrated circuits and methods for wireless interactions with composite integrated circuits.

BACKGROUND

To access an information stored in a chip, conventionally, it requires extra power supplied and a sophisticated installation on tester, for example a probing card (or any other equipment) which may cause inconvenience. In addition, a manual touch or a machine contact would induce electrostatic discharge (ESD) damage for the chip.

Tracking information through controlled collapse chip connection (C4)/through substrate via (TSV) increases area penalty (extra layout of power/ground/signals on C4/TSV), and once one of the connections fails, the information is unreadable.

3DIC comprises a plurality of stacked chips provided from different companies or processes, and needs complete information recorded and being freely written/read, and the complete information comprises: company information, wafer tracking information (e.g., fabrication, process, part name and die-location), chip specification (test condition/setup and/or test results/parameters), and testing execution. Thus, there is a need to solve the above-mentioned problems.

SUMMARY

In accordance with one aspect of the present disclosure, a method for wireless information access in a three-dimensional integrated circuit (3DIC) includes steps of providing plural stacked chips including a wireless device, an information and a transmitting/receiving circuit; and accessing wirelessly the information via the wireless device and the transmitting/receiving circuit during a packaging process for the plural stacked chips.

In accordance with another aspect of the present disclosure, a testing method comprises steps of: providing a semiconductor structure having a wireless chip; wirelessly receiving a power by the wireless chip; and using the power to test the semiconductor structure.

In accordance with one more aspect of the present disclosure, a 3DIC comprises a semiconductor structure, and a wireless power device (WPD) formed on the semiconductor structure for wirelessly receiving a power for operating a function selected from a group consisting of probing the semiconductor structure, testing the semiconductor structure and accessing a first information from the semiconductor structure.

The present disclosure may best be understood through the following descriptions with reference to the accompanying drawings, in which;

DETAILED DESCRIPTION

Figure 1:
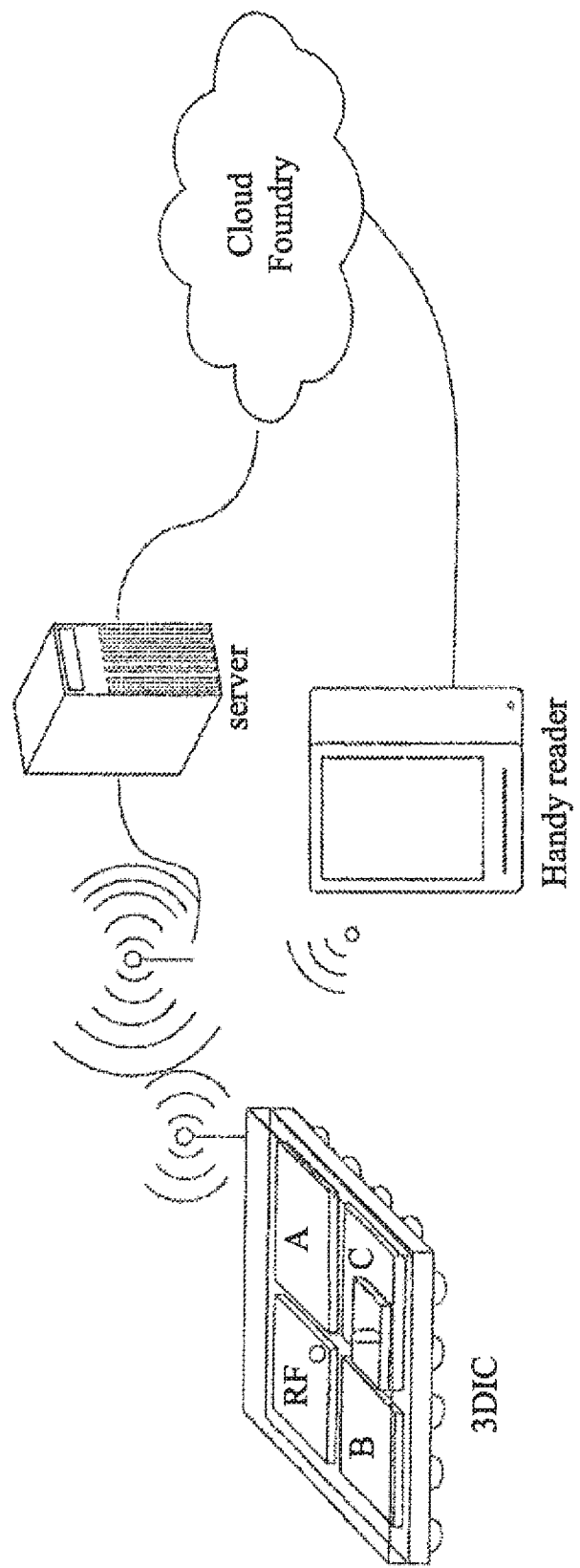
FIG. 1 is a schematic diagram of a 3DIC stacking, a server, a cloud foundry and a handy reader according to the first embodiment of the present disclosure.

The present disclosure will be described with respect to particular embodiments and with reference to certain drawings, but the disclosure is not limited thereto but is only limited by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice.

The present disclosure provides a 3DIC stacking, having a wireless power device (WPD) for wirelessly receiving a power for operating a function selected from a group consisting of probing the semiconductor structure, testing the semiconductor structure and accessing an information from the semiconductor structure, and a method thereof to avoid the ESD damage and the area penalty.

The present disclosure relates to a wireless tracking implement on a 3DIC stacking, and provides a chip information anywhere without any equipment installation. FIG. 1 is a schematic diagram of a 3DIC stacking, a server, a cloud foundry and a handy reader according to the first embodiment of the present disclosure. The configuration of FIG. 1 is set up for wirelessly accessing the information contained in a 3DIC stacking. The 3DIC stacking and the server are wirelessly connected, there are two antennas shown in FIG. 1 too, where one antenna is for the 3DIC stacking and the other is for the server, and the 3DIC stacking and the handy reader are also wirelessly connected. However, the server and the cloud foundry are connected by a connection line, and so are the cloud foundry and the handy reader. The 3DIC stacking includes the chips (A, B, C and D) to be wirelessly accessed, which contains required information such as chip manufacturer's information, wafer tracking information, chip spec. and test execution information, and a radio frequency circuit (RF) for transmitting/receiving a radio frequency signal to/from the antenna of the 3DIC stacking. The Handy reader is an electronic book, being a tool for a user to read/write an information from/to the 3DIC stacking. The Cloud Foundry is an open platform as a service (also known as an open source cloud computing platform as a service (PaaS) software developed by VMware released under the terms of the Apache License 2.0). The server is a physical computer (a computer hardware system) dedicated to running one or more client-server services (as a host), to serve the needs of users of the other computers (clients) on the network. The server could be an Automatic or Automated Test Equipment (ATE), or the like. Each antenna is an electrical device which converts electric currents into radio waves, and vice versa. Each the antenna is usually used with a radio transmitter or radio receiver. In transmission, a radio transmitter applies an oscillating radio frequency electric current to the antenna's terminals, and the antenna radiates the energy from the current as electromagnetic waves (radio waves). In reception, an antenna intercepts some of the power of an electromagnetic wave in order to produce a tiny voltage at its terminals that is applied to a receiver to be amplified. Each the antenna can be used for both transmitting and receiving. There are two connection lines, relatively between the Handy reader and the Cloud Foundry, and between the Cloud Foundry and the server, such that the required information related to the 3DIC stacking is quickly provided to (the user of) the Handy reader via the Cloud Foundry and the server in some embodiments. In some other embodiments, the user of the Handy reader sends out an instruction regarding the access of the information contained in the 3DIC stacking (e.g., reading an information) from the Handy reader via the antenna of the 3DIC stacking to the 3DIC stacking, and the 3DIC stacking reacts to provide a reply through the antenna of the 3DIC stacking, the antenna connected to the server, the server, the Cloud Foundry to the Handy reader such that the information contained in the 3DIC stacking is provided to (the user of) the Handy Reader. In some other embodiments, the user of the Handy reader sends out instructions regarding the access of the information contained in the 3DIC stacking (e.g., writing an information) from the Handy reader to the antenna of the 3DIC stacking and to the Cloud Foundry such that the information to be written could be sent to the 3DIC stacking through the Cloud foundry, the server, the antenna connected to the server, and the antenna of the 3DIC stacking. In some other embodiments, the user of the Handy reader sends out instructions regarding the access of the information contained in the 3DIC stacking (e.g., writing/reading an information) from the Handy reader to the antenna of the 3DIC stacking and receives the response of the 3DIC stacking from the antenna of the 3DIC stacking directly too.

Figure 2:
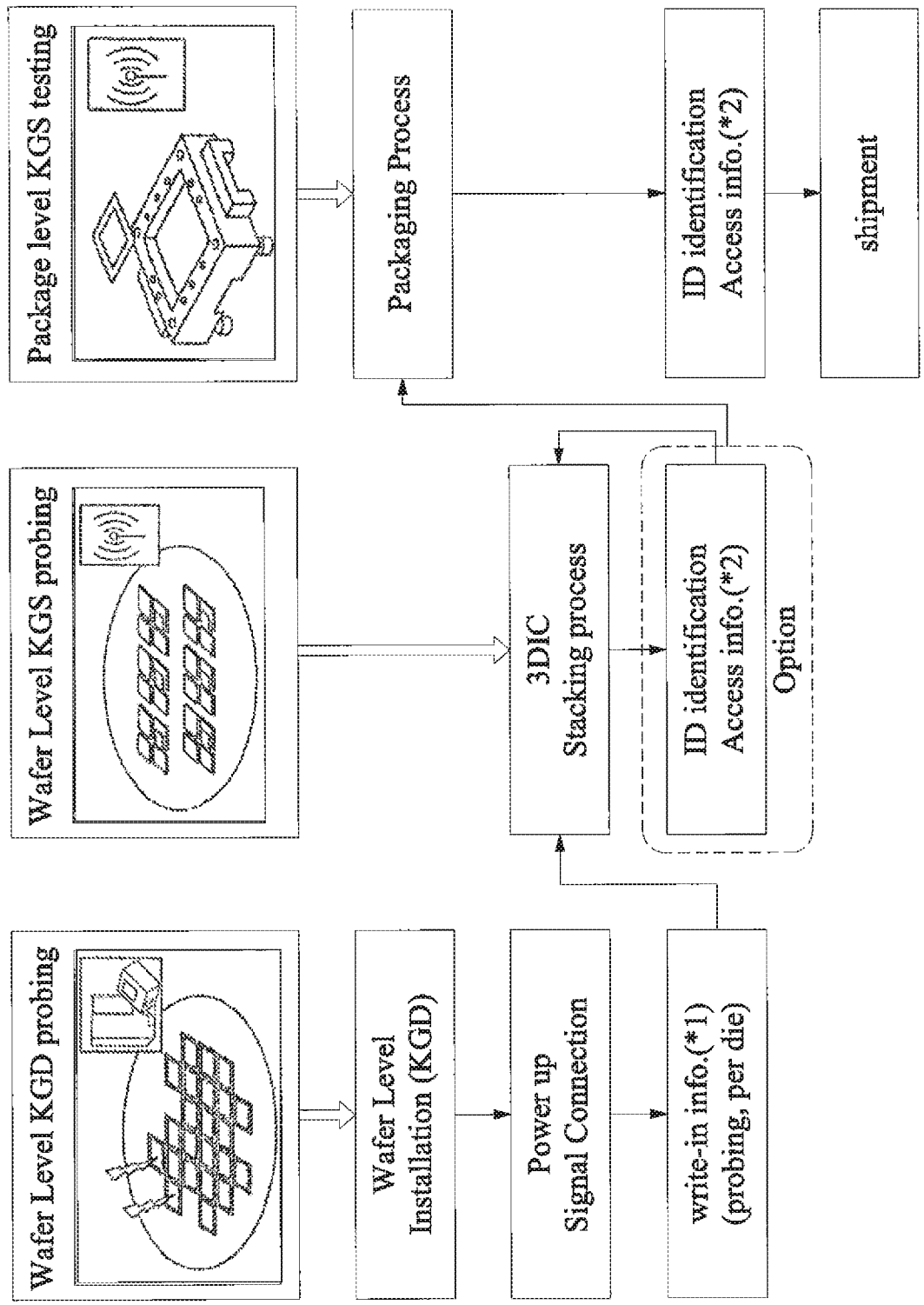
FIG. 2 is a flow chart of a method for a wireless information access of a 3DIC stacking according to the second embodiment of the present disclosure.

FIG. 2 is a flow chart of a method for a wireless information access of a 3DIC stacking according to the second embodiment of the present disclosure. In the KGD (known good die) probing stage of the wafer level, a conventional installation including a tester as aforementioned is involved. But in accordance with the present disclosure, in the KGS (known good stacking) probing stage of the wafer level, and in the KGS testing stage of the package level, no tester is required, and the information is accessed wirelessly through a configuration as shown in FIG. 1. Since the information is accessed wirelessly in the KGS probing stage of the water level and in the KGS testing stage of the package level, and the wafer level installation for KGS as well as a power up signal connection required in both of the conventional KGS probing stage of the wafer level and the conventional KGS testing stage of the package level could be omitted. In the KGD probing stage of the wafer level, it performs a wafer level installation for KGD and a power up signal connection, and provides a write-in information (*1) for probing per die. Since a conventional tester is used in the KGD probing stage of the wafer level, the power needs to be provided after the KGD is installed in the tester such that the write-in information (*1) for probing per die could be proceeded when the power is turned on, in the wafer level, the KGS probing stage, it performs the 3DIC stacking process and provides an ID identification access information (*2), which is an optional step. In the package level, the KGS testing stage, it performs the packaging process, provides the ID identification access information (*2), and executes the shipment, where (*1) means write-in ID is necessary and writing/reading other data or testing are (is) optional, and (*2) means ID verification is necessary and writing/reading other data or testing are (is) optional. Since providing the ID identification access information (*2) is an optional step, there might be three different routes. The first one is from performing the stacking process to performing the packaging process, the second one is from performing the stacking process to providing the ID identification access information (*2) and then to performing the stacking process again, and the third one is from performing stacking process to providing the ID identification access information (*2) and then to performing the packaging process. The wireless information access is performed through embedded wireless chips.

Figure 3:
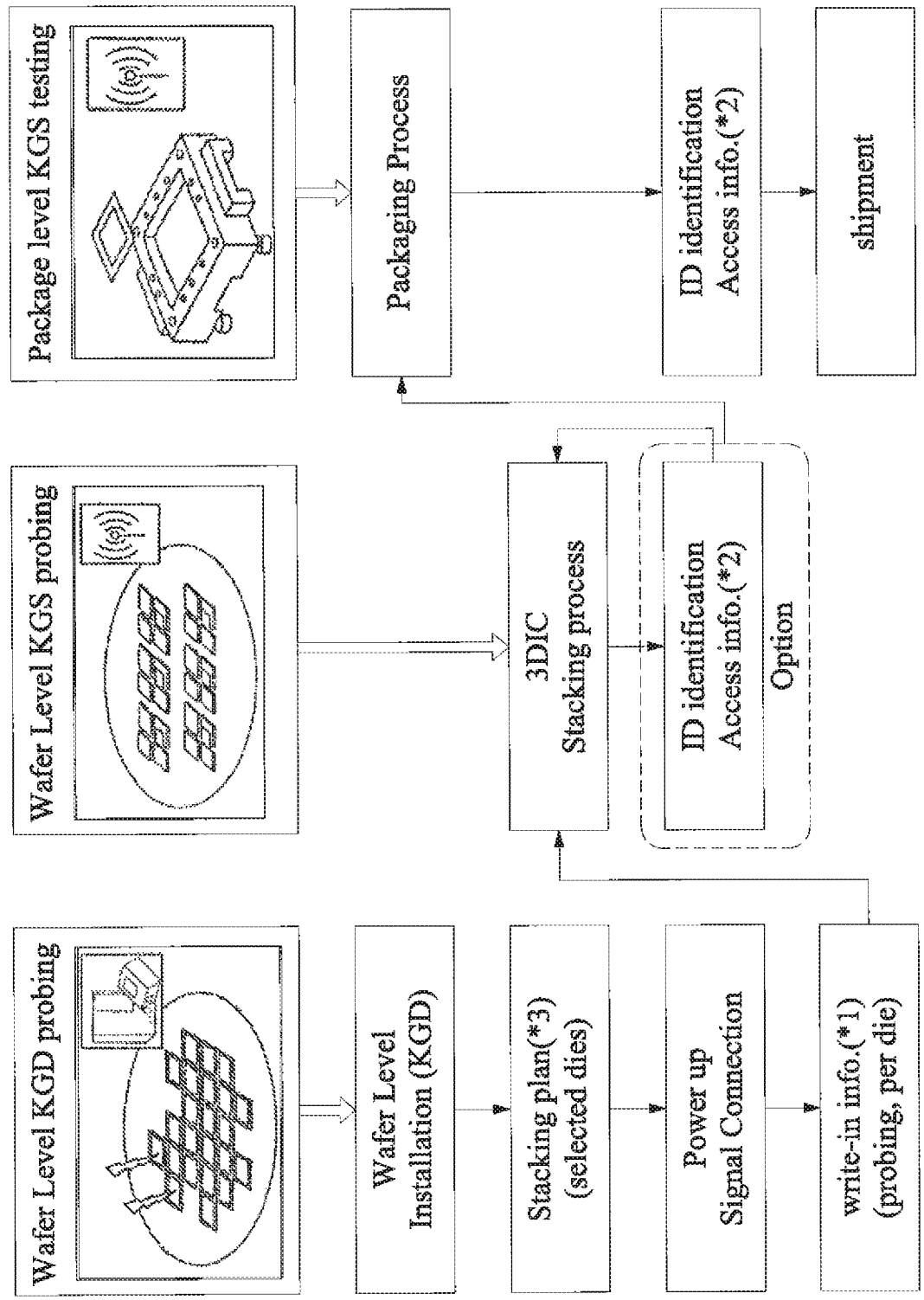
FIG. 3 is a flow chart of a method for a wireless information access of a 3DIC stacking according to the third embodiment of the present disclosure.

FIG. 3 is a flow chart of a method for a wireless information access of a 3DIC stacking according to the third embodiment of the present disclosure. FIG. 3 is similar to FIG. 2 except that there is an extra step of providing a stacking plan (*3) for selected dies between performing a wafer level installation for KGD and performing a power up signal connection, the stacking plan is provided for certain chips purchased from other manufacturers or having no stacking plan at all, where (*3) indicates that the stacking plan of selected dies is decided by testing results and products after the KGD testing is done. The stacking plan is used to determine where these selected dies should be stacked on and whether a tracking die should be used. Similarly, since a conventional tester is used in the KGD probing stage of the wafer level, the power needs to be provided after the KGD is installed in the tester also such that the write-in information (*1) for probing per die could be proceeded when the power is turned on as shown in FIG. 3. Referring to FIG. 3, since the information is accessed wirelessly in the KGS probing stage of the wafer level and in the KGS testing stage of the package level, the wafer level installation for KGS as well as a power up signal connection required in both of the conventional KGS probing stage of the wafer level and the conventional KGS testing stage of the package level could be omitted too. The wireless information access is either performed through embedded wireless chips, or performed through extra embedded wireless chips (for those chips without any radio frequency (RF) circuit), which is accomplished via a configuration as shown in FIG. 1.

Figure 4:
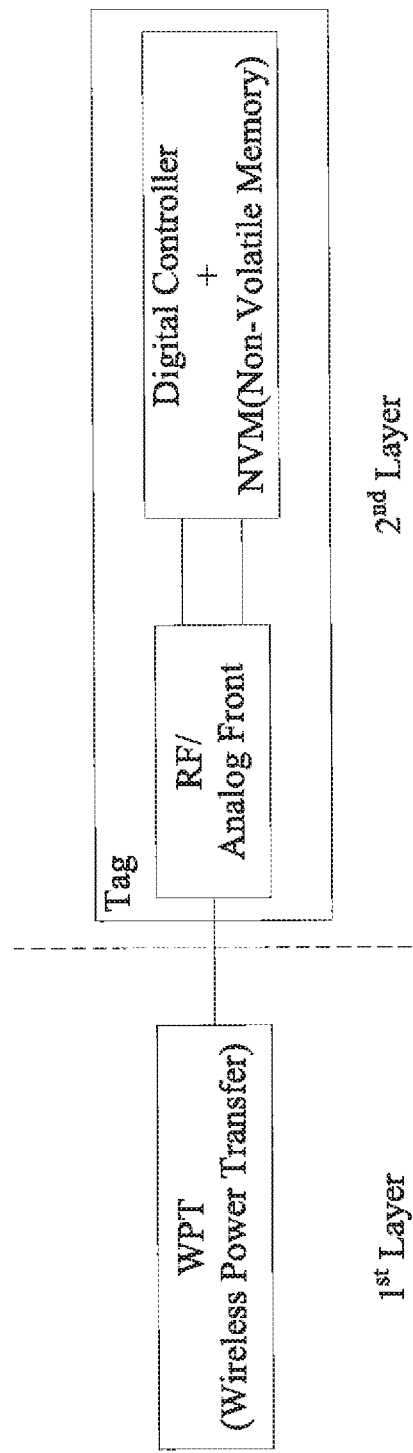
FIG. 4 is a schematic diagram of a wireless power transfer (WPT) and a tag having an RF/analog front end, digital controller and a non-volatile memory (NVM) according to the fourth embodiment of the present disclosure.

FIG. 4 is a schematic diagram of a wireless power transfer (WPT) and a tag having an RF/analog front end, digital controller and a non-volatile memory (NVM) according to the fourth embodiment of the present disclosure. The tag functions as a controller/register, the RF/analog front end performs all analog processing for DC power, receives signal detection/demodulation, and transmits modulation, the digital controller decodes incoming data, responds to commands from the transmitter (reader), reads and writes to internal memory, and encodes and transmits data to the modulator included in the RE/analog front end, and the NVM is necessary for one-time or multi-time data storage.

The function block of WPT is used as power transfer interface functioning as an antenna, the WPT can be made as an antenna, a capacitor, an inductor or any interface to receive power, and the WPT and the Tag are in the same chip or in two different stacked chips. The configuration of the WPT in the first layer and the tag in the second layer as shown in FIG. 4 is used as an embedded wireless chip/IP in 3DIC stacked chip to record information.

Figure 5A:
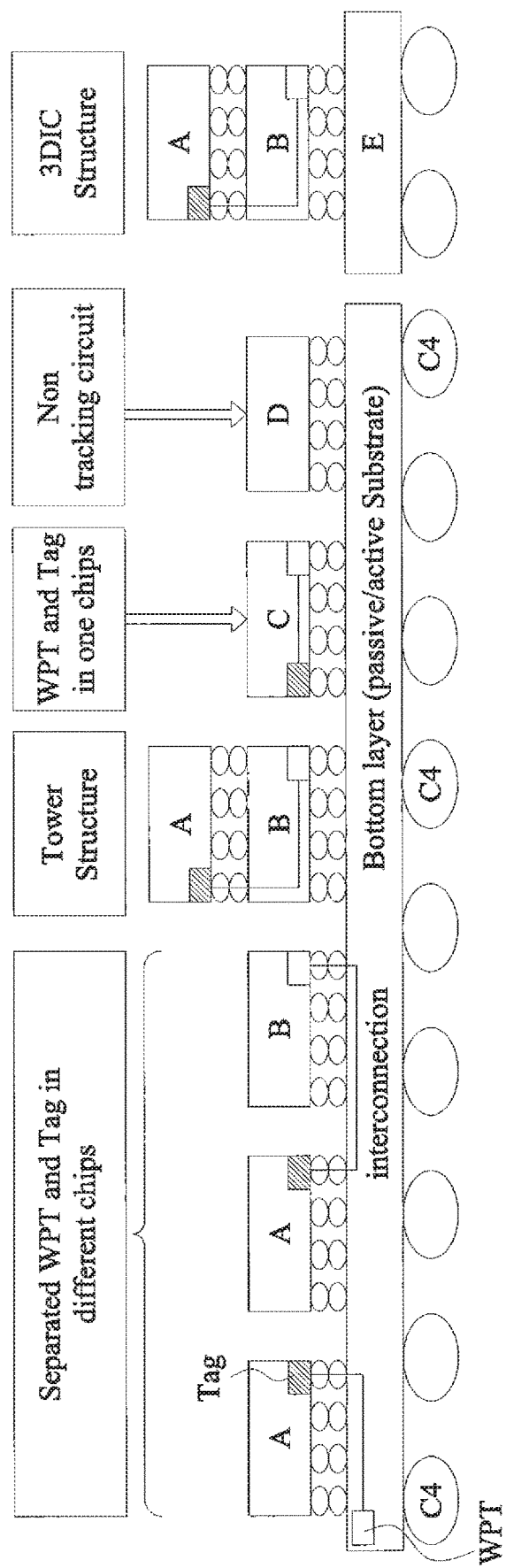
FIG. 5(a) is a schematic circuit diagram of two 3DIC stockings according to the fifth embodiment of the present disclosure.

FIG. 5(a) is a schematic circuit diagram of two 3DIC stockings according to the fifth embodiment of the present disclosure. The first 3DIC stacking located on the left-hand side has a bottom layer being one of a passive substrate or an active substrate with a plurality of C4 bumps disposed under the bottom layer of the first 3DIC stacking, and shows separated WPT and Tag in different chips, wherein the first WPT is disposed in the bottom layer, a first chip A has a tag disposed therein and connected with the first WPT, a second chip A has a tag disposed therein, and a chip B has a WPT disposed therein and connected to the tag of the second chip A. Also, the first 3DIC stacking includes a tower structure with a chip A and a chip B, wherein the chip A is disposed on the chip B and the chip B is disposed on the bottom layer. Furthermore, the first 3DIC stacking has a WPT and a Tag in one chip too, wherein the chip C having the WPT and the tag is disposed on the bottom layer. Lastly, the first 3DIC stacking also includes a nontracking circuit being a chip D disposed on the bottom layer and having no WPT/tag. The second 3DIC stacking is located on the right-hand side, has a bottom layer of E being a passive substrate or an active substrate, a chip A and a chip B, the chip A is disposed on the chip B and the chip B is disposed on the bottom layer.

Figure 5B:
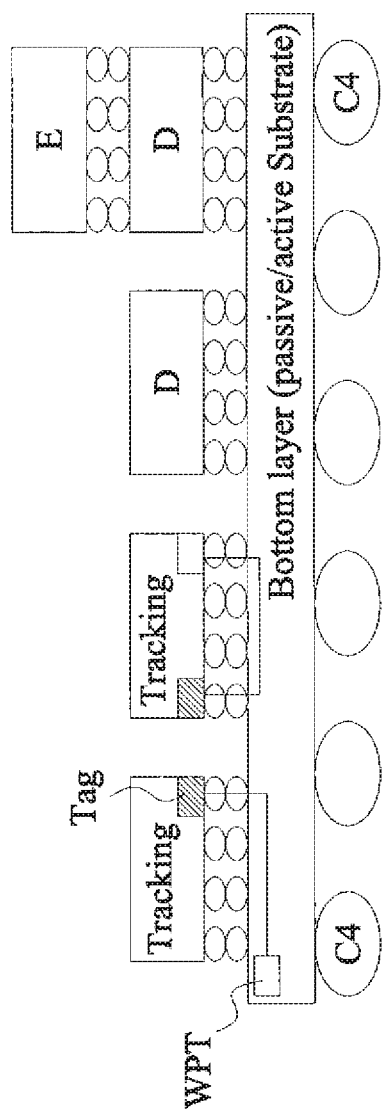
FIG. 5(b) is a schematic circuit diagram of a 3DIC stacking according to the sixth embodiment of the present disclosure.

FIG. 5(b) is a schematic circuit diagram of a 3DIC stacking according to the sixth embodiment of the present disclosure. In FIG. 5(b), at least one extra wireless chip (e.g., two tracking chips, wherein the first WPT is disposed in the bottom layer, being one of a passive substrate and an active substrate, the first tracking chip has a tag disposed therein and connected to the first WPT, and the second tracking chip has a second WPT and a tag connected to the second. WPT therein) is utilized to record information for chips/stacked chips without any RF circuit (e.g., a first chip D and a second chip D and a chip E, wherein the first chip D is disposed on the bottom layer, the chip E is disposed on the second chip D, and the second chip D is disposed on the bottom layer).

Figure 5C:
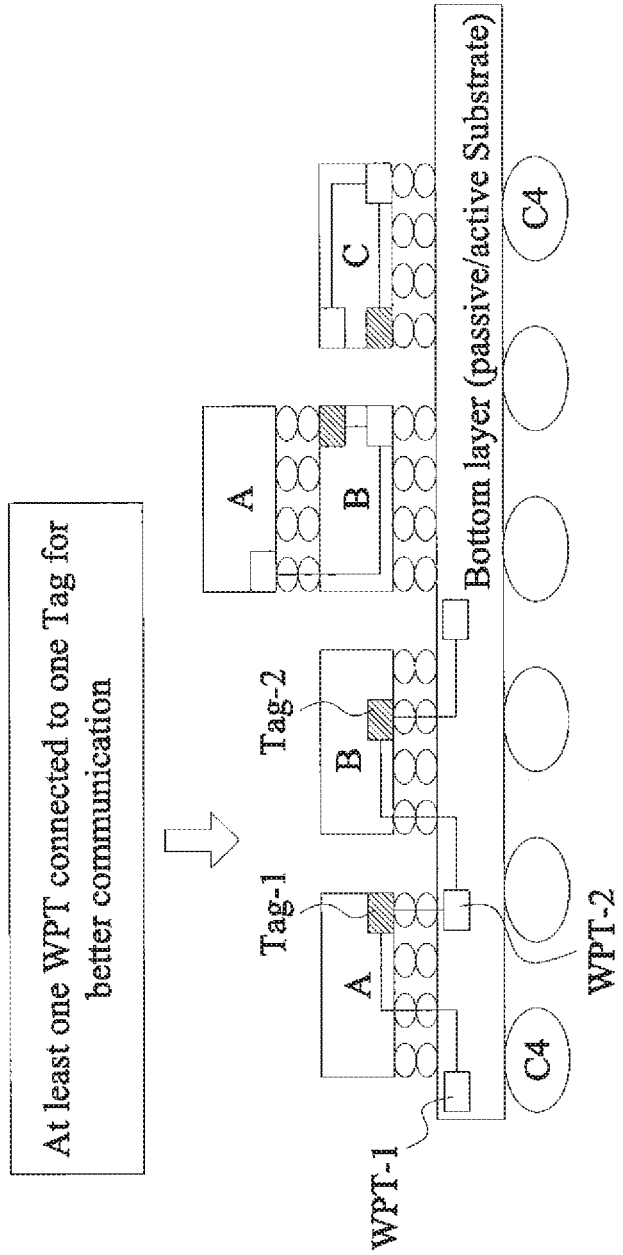
FIG. 5(c) is a schematic circuit diagram of a 3DIC stacking according to the seventh embodiment of the present disclosure.

FIG. 5(c) is a schematic circuit diagram of a 3DIC stacking according to the seventh embodiment of the present disclosure. It is desired to have a plurality of WPTs connecting to (at least) one tag for better transmitting/receiving operations. As shown in FIG. 5(c), there are the first and the second WPTs, WPT-1 and WPT-2, both disposed in the bottom layer, being one of a passive and an active substrate, and connected to a first tag, Tag-1 disposed in a first chip A. There is a second tag, Tag-2, disposed in a first chip B, and WPT-2 and a third WPT, disposed in the bottom layer, are both connected to Tag-2. Also, a second chip A having a fourth WPT is disposed on a second chip B having a third tag and a fifth WPT and disposed on the bottom layer. The fourth and the fifth WPTs are both connected to the third tag. Besides, there is a chip C having a sixth and a seventh WPTs and a fourth tag, and both of the sixth and the seventh WPTs are connected to the fourth tag. Thus, in FIG. 5(c), it shows at least one WPT is connected to one Tag for better communication.

Figure 5D:
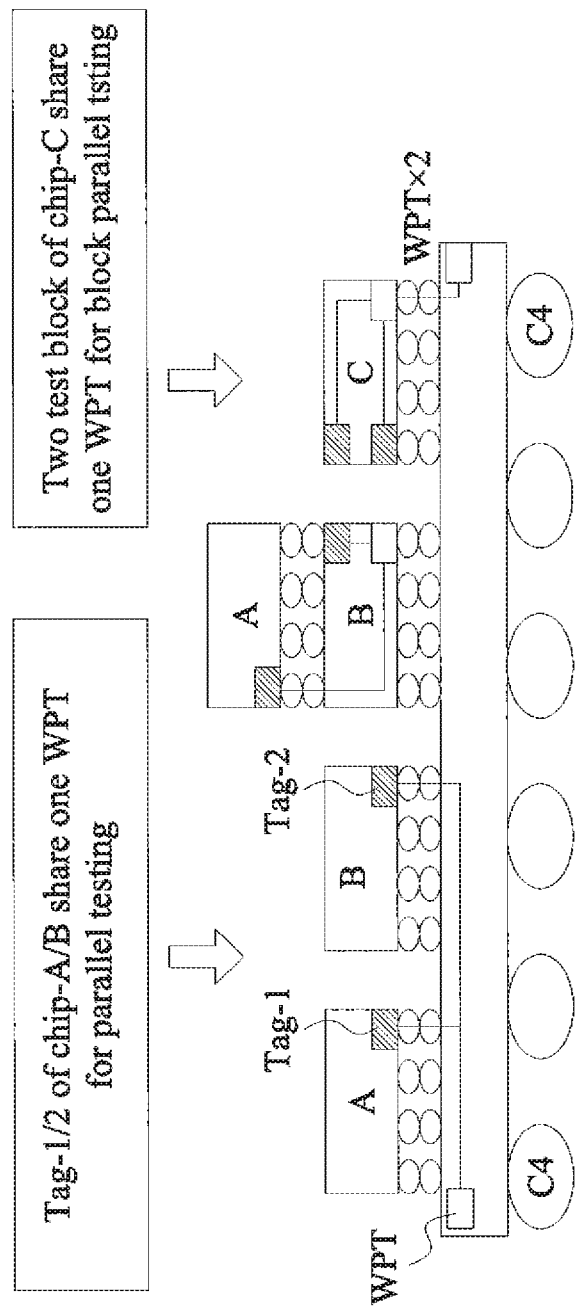
FIG. 5(d) is a schematic circuit diagram of a 3DIC stacking according to the eighth embodiment of the present disclosure.

FIG. 5(d) is a schematic circuit diagram of a 3DIC stacking according to the eighth embodiment of the present disclosure. It is desired to have (at least) one WPT connects to plurality of tags for parallel testing operations. In FIG. 5(d), Tag-1 of a first chip A, disposed on the bottom layer being one of a passive substrate or an active substrate, and Tag-2 of a first chip B, disposed on the bottom layer, share a first WPT disposed in the bottom layer for parallel testing. A second chip A having a third tag is disposed on a second chip B having a fourth tag and a second WPT, and the third and the fourth tags share the second WPT. And, two test blocks, the fifth and the sixth tags of chip-C disposed on the bottom layer, share a third WPT for block parallel testing. There is also a fourth WPT disposed in the bottom layer and connected to the third WPT.

EMBODIMENTS

There is a method for wireless information access in a three-dimensional integrated circuit (3DIC) provided in the present disclosure. This proposed method includes steps of:

providing plural stacked chips including a wireless device, an information and a transmitting/receiving circuit; and accessing wirelessly the information via the wireless device and the transmitting/receiving circuit during a packaging process for the plural stacked chips. In this embodiment, the wireless device is a wireless power transfer device (WPTD).

There is a testing method proposed in the present disclosure. This testing method includes steps of:

providing a semiconductor structure having a wireless chip;

wirelessly receiving a power by the wireless chip; and using the power to test the semiconductor structure. In this embodiment, the wireless chip is a wireless power transfer device (WPTD).

There is a 3DIC provided in the present disclosure. This 3DIC includes a semiconductor structure, and a wireless power device (WPD) formed on the semiconductor structure for wirelessly receiving a power for operating a function selected from a group consisting of probing the semiconductor structure, testing the semiconductor structure and accessing a first information from the semiconductor structure. In this embodiment, the WPD is a wireless power transfer device (WPTD).

According to the aforementioned descriptions, the present disclosure provides a 3DIC having a wireless power device (WPD) for wirelessly receiving a power for operating a function selected from a group consisting of probing the semiconductor structure, testing the semiconductor structure and accessing an information from the semiconductor structure and a method thereof to avoid the ESD damage and the area penalty so as to possess the nonobviousness and the novelty.

Figure 6:
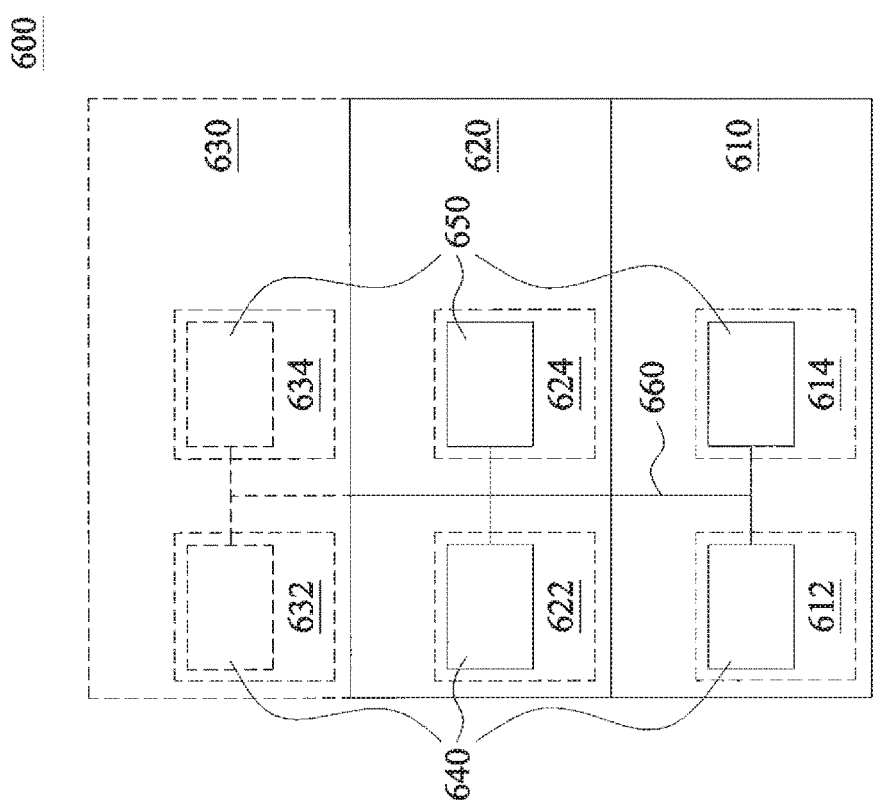
FIG. 6 is a schematic diagram of a composite integrated circuit, in accordance with some embodiments.

FIG. 6 is a schematic diagram of a composite integrated circuit (IC) 600, in accordance with some embodiments. Composite IC 600 is a semiconductor structure that includes a first circuit layer 610, a second circuit layer 620, and, in some embodiments, a third circuit layer 630. Composite IC 600 also includes one or more wireless power devices (WPDs) 640 and one or more tracking circuits 650. One or more WPDs 640 are electrically connected to one or more tracking circuits 650 through interconnection structures 660.

In some embodiments, composite IC 600 is a 3DIC stacking similar to a 3DIC described above with respect to FIG. 5(*a*), 5(*b*), 5(*c*), or 5(*d*). In some embodiments, composite IC 600 is a package-on-package (PoP) structure. In some embodiments, composite IC 600 is a chip-on-wafer-on-substrate (CoWoS®) structure. In some embodiments, composite IC 600 is a fan-out wafer level chip scale package (FO-WLCSP) structure. In some embodiments, composite IC 600 is an integration FO-WLCSP package on-package (InFO-PoP) structure. In some embodiments, composite IC 600 is a fan-in wafer level chip scale package (FI-WLCSP) structure. In some embodiments, composite IC 600 is an under-bump-metallization (UBM)-free FI-WLCSP (UPI) structure.

First circuit layer 610 includes an IC chip, wafer, and/or substrate with at least one electrical circuit. In some embodiments, the at least one electrical circuit is an integrated circuit. In some embodiments, the at least one electrical circuit has only passive elements such as metal traces, bumps, and through-silicon vias (TSVs).

In some embodiments, first circuit layer 610 is a bottom layer described above with respect to FIG. 5(*a*), 5(*b*), 5(*c*), or 5(*d*). In some embodiments, first circuit layer 610 is a substrate. In some embodiments in which composite IC 600 is a chip on wafer on substrate (CoWoS®) structure, first circuit layer 610 is a wafer on a substrate. In some embodiments in which composite IC 600 is a FO-WLCSP or FI-WLCSP structure, first circuit layer 610 is a wafer.

In some embodiments, first circuit layer 610 includes a first circuit sub-layer 612. If present, first circuit sub-layer 612 is a circuit component of first circuit layer 610. In some embodiments, first circuit sub-layer 612 is an IC chip of first circuit layer 610. In some embodiments, first circuit sub-layer 612 is an IC chip package of first circuit layer 610. In some embodiments, first circuit sub-layer 612 is a substrate of first circuit layer 610. In some embodiments, first circuit sub-layer 612 is a wafer of first circuit layer 610.

In some embodiments, first circuit layer 610 includes a second circuit sub-layer 614. If present, second circuit sub-layer 614 is a circuit component of first circuit layer 610. In some embodiments, second circuit sub-layer 612 is an IC chip of first circuit layer 610. In some embodiments, second circuit sub-layer 612 is an IC chip package of first circuit layer 610. In some embodiments, second circuit sub-layer 612 is a substrate of first circuit layer 610. In some embodiments, second circuit sub-layer 612 is a wafer of first circuit layer 610. In some embodiments, first circuit layer 610 includes additional sub-layers (not shown).

Second circuit layer 620 includes at least one IC chip 622 or IC chip 624. In some embodiments, second circuit layer 620 includes both IC chip 622 and IC chip 624. In some embodiments, second circuit layer 620 includes both IC chip 622 and IC chip 624 and at least one additional IC chip (not shown). In some embodiments, one or more of IC chips 622 or 624 is a chip A, B, C, or D in contact with a bottom layer as described above with respect to FIG. 5(*a*), 5(*b*), 5(*c*), or 5(*d*).

In some embodiments, IC chip 622 is an IC chip package of second circuit layer 620. In some embodiments, IC chip 624 is an IC chip package of second circuit layer 620.

If present, third circuit layer 630 includes at least one IC chip 632 or IC chip 634. In some embodiments, third circuit layer 630 includes both IC chip 632 and IC chip 634. In some embodiments, third circuit layer 630 includes both IC chip 632 and IC chip 634 and at least one additional IC chip (not shown). In some embodiments, one or more of IC chips 632 or 634 is a chip A or E separated from a bottom layer by another chip as described above with respect to FIG. 5(*a*), 5(*b*), 5(*c*), or 5(*d*).

In some embodiments, IC chip 632 is an IC chip package of third circuit layer 630. In some embodiments, IC chip 634 is an IC chip package of third circuit layer 630. In some embodiments, third circuit layer 630 includes multiple sub-layers and each sub-layer includes one or more IC chips 632 and/or 634 as described above with respect to third circuit layer 630.

In some embodiments, ICs of first circuit layer 610, second circuit layer 620, and, if present, third circuit layer 630 are resources from different processes (e.g., N40, N65). In some embodiments, ICs of first circuit layer 610, second circuit layer 620, and, if present, third circuit layer 630 are resources from different manufacturers. In some embodiments, ICs of first circuit layer 610, second circuit layer 620, and, if present, third circuit layer 630 are resources that are integrated based on functionality (e.g., central processing unit (CPU) and graphics processing unit (GPU)) or specified performance levels (e.g., speed and power consumption).

A WPD 640 is a WPT device such as an antenna, capacitor, inductor, or other interface capable of extracting energy from an electromagnetic signal and generating a power supply voltage.

Composite IC 600 includes at least one WPD 640 either in first circuit layer 610 or in second circuit layer 620, as depicted in FIG. 6. Each WPD 640 is a wireless power device configured to receive and/or transmit data in accordance with radio-frequency identification (RFID), WiFi, 802.11, Bluetooth, ZigBee, near-field communication (NFC), or other wireless standards. In some embodiments, one or more WPD 640 is a WPT device as described above with respect to FIG. 4.

In some embodiments, composite IC 600 includes at least one WPD 640 in each of first circuit layer 610 and second circuit layer 620. In some embodiments, composite IC 600 includes one or more WPDs 640 in third layer 630, if present.

In some embodiments, composite IC 600 includes a WPD 640 in first sub-layer 612. In some embodiments, composite IC 600 includes a WPD 640 in first sub-layer 612 and at least one additional WPD 640 in at least one additional sub-layer of first circuit layer 610 (not shown).

In some embodiments, composite IC 600 includes a WPD 640 in IC chip 622. In some embodiments, composite IC 600 includes a WPD 640 in IC chip 622 and at least one additional WPD 640 in at least one additional IC chip (not shown) of second circuit layer 620.

In some embodiments, composite IC 600 includes a WPD 640 in IC chip 632. In some embodiments, composite IC 600 includes a WPD 640 in IC chip 632 and at least one additional WPD 640 in at least one additional IC chip (not shown) of third circuit layer 630.

Composite IC 600 includes at least one tracking circuit 650 either in first circuit layer 610 or in second circuit layer 620, as depicted in FIG. 6. A tracking circuit is a circuit capable of receiving a power supply voltage and responding to an instruction extracted from an electromagnetic signal by storing and/or outputting tracking data. Tracking data are data related to one or more components of the composite IC. In some embodiments, tracking data are data related to chip or IC identification, origin, performance, function, or test results.

In some embodiments, a tracking circuit is configured to be capable of executing a circuit test in response to an instruction extracted from an electromagnetic signal and to store and/or output test result data as tracking data. In some embodiments, a tracking circuit is configured to be capable of executing a circuit test in response to an instruction extracted from an electromagnetic signal and to store and/or output test result data indicative of circuit speed or power consumption as tracking data.

In some embodiments, one or more tracking circuits 650 is a circuit configured to extract instructions from electromagnetic signals conforming to RFID, WiFi, 802.11, Bluetooth, ZigBee, NFC, or other wireless standards. In some embodiments, one or more tracking circuits 650 is a tag as described above with respect to FIG. 4.

In some embodiments, composite IC 600 includes at least one tracking circuit 650 in each of first circuit layer 610 and second circuit layer 620. In some embodiments, composite IC 600 includes one or more tracking circuits 650 in third layer 630, if present.

In some embodiments, composite IC 600 includes a tracking circuit 650 in second sub-layer 614. In some embodiments, composite IC 600 includes a tracking circuit 650 in second sub-layer 614 and at least one additional tracking circuit 650 in at least one additional sub-layer of first circuit layer 610 (not shown).

In some embodiments, composite IC 600 includes a tracking circuit 650 in IC chip 624. In some embodiments, composite IC 600 includes a tracking circuit 650 in IC chip 624 and at least one additional tracking circuit 650 in at least one additional IC chip (not shown) of second circuit layer 620.

In some embodiments, composite IC 600 includes a tracking circuit 650 in IC chip 634. In some embodiments, composite IC 600 includes a tracking circuit 650 in IC chip 634 and at least one additional tracking circuit 650 in at least one additional IC chip (not shown) of third circuit layer 630.

Interconnection structures 660 are sets of interconnection structures configured to provide electrical connections between one or more of WPDs 640 and one or more of tracking circuits 650. Interconnection structures 660 include conductive elements located on one or more of first circuit layer 610, second circuit layer 620, and, if present, third circuit layer 630. Non-limiting examples of conductive elements include metal lines, vias, TSVs, UBM structures, bumps, wires, and post-passivation structures.

In some embodiments, an interconnection structure of interconnection structures 660 is configured to provide electrical connections between a single WPD 640 and a single tracking circuit 650. In some embodiments, an interconnection structure of interconnection structures 660 is configured to provide electrical connections between a single WPD 640 and multiple tracking circuits 650. In some embodiments, an interconnection structure of interconnection structures 660 is configured to provide electrical connections between multiple WPDs 640 and a single tracking circuit 650. In some embodiments, interconnection structure of interconnection structures 660 is configured to provide electrical connections between multiple WPDs 640 and multiple tracking circuits 650. In some embodiments, interconnection structures 660 include an interconnection in a bottom layer as depicted in FIG. 5(a).

In some embodiments, an interconnection structure of interconnection structures 660 is configured to provide electrical connections between a WPD and a tracking circuit on a same circuit layer. In some embodiments, an interconnection structure of interconnection structures 660 is configured to provide electrical connections between a WPD 640 and a tracking circuit 650 on different circuit layers.

Figure 7:
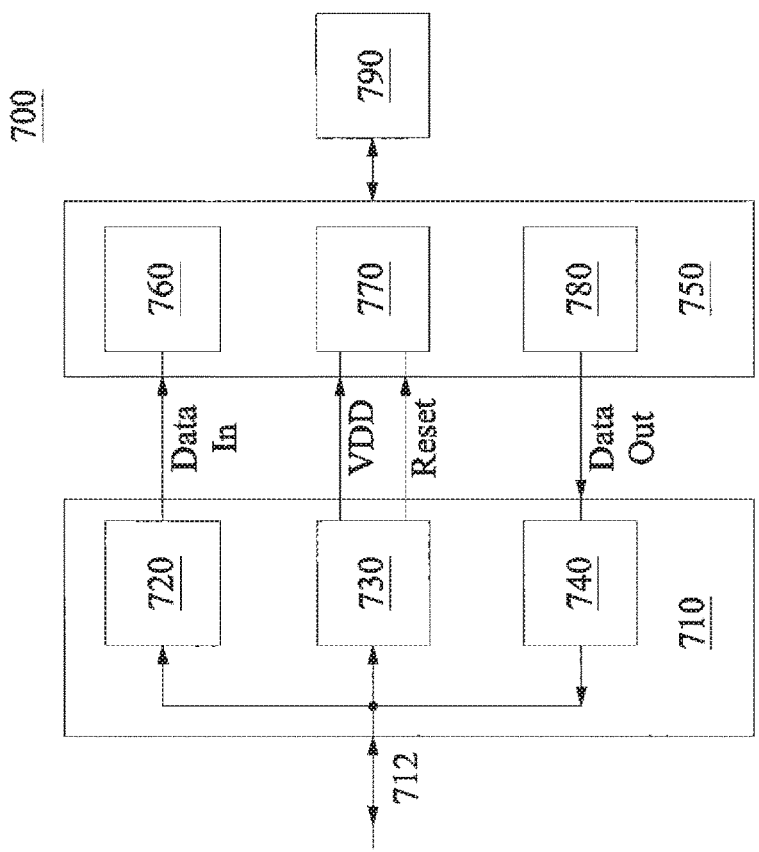
FIG. 7 is a schematic diagram of a tracking circuit, in accordance with some embodiments.

FIG. 7 is a schematic diagram of a tracking circuit 700, in accordance with some embodiments. Tracking circuit 700 is usable as a tag described above with respect to FIG. 4 and/or as a tracking circuit 650 of composite IC 600 described above with respect to FIG. 6.

Tracking circuit 700 includes front end circuit 710, digital controller 750, and non-volatile memory (NVM) 790. Front end circuit 710 includes I/O port 712, demodulator 720, AC/DC converter 730, and modulator 740. Digital controller 750 includes parser/decoder 760, main control unit 770, and encoder/framer 780. Demodulator 720 is configured to provide a signal Data In to parser/decoder 760, and encoder/framer 780 is configured to provide a signal Data Out to modulator 740. Tracking circuit 700 is configured to deliver a DC power signal VDD and a power-on reset signal Reset from AC/DC converter 730 to main control unit 770. Tracking circuit 700 is further configured to provide two-way communication between main control unit 770 and NVM 790.

In some embodiments, front end circuit 710 is an RF/Analog front end as described above with respect to FIG. 4. In some embodiments, digital controller 750 is a digital controller as described above with respect to FIG. 4. In some embodiments, NVM 790 is an NVM as described above with respect to FIG. 4.

Front end circuit 710 is a circuit configured to receive an electromagnetic signal through I/O port 712. The electromagnetic signal includes energy in the form of a power supply voltage or information in the form of a modulated signal. In some embodiments, front end circuit 710 is configured to receive the electromagnetic signal from one or more WPDs 640 of composite IC 600 described above with respect to FIG. 6.

Front end circuit 710 is further configured to output a modulated electromagnetic signal though I/O port 712. In some embodiments, front end circuit 710 is configured to output the modulated electromagnetic signal to one or more WPDs 640 of composite IC 600 described above with respect to FIG. 6.

Demodulator 720 is a circuit configured to receive and demodulate the electromagnetic signal and output the demodulated electromagnetic signal as digital signal Data In. In some embodiments, demodulator 720 includes an envelope detector (not shown) configured to demodulate the electromagnetic signal and output signal Data In or a clock signal (not shown).

AC/DC converter 730 is a circuit configured to generate DC power signal VDD and power-on reset signal Reset based on the electromagnetic signal. In some embodiments, AC/DC converter 730 comprises a charge pump (not shown) configured to rectify the electromagnetic signal or a voltage regulator (not shown) configured to limit and regulate charge pump output to generate DC power signal VDD and power-on reset signal Reset.

Modulator 740 is a circuit configured to receive digital signal Data Out and generate a modulated electromagnetic signal based on signal Data Out.

Parser/decoder 760 is a circuit configured to decode received signal Data In and output parsed commands to main control unit 770. In some embodiments, parser/decoder 760 includes separate decoder and parser circuits (not shown).

Main control unit 770 is a circuit configured to control operations of digital controller 750 by receiving DC power VDD and power-on reset signal Reset, and executing parsed commands to communicate with NVM 790 and output replied data to encoder/framer 780. In some embodiments, main control unit 770 includes a power management circuit (not shown) configured to control power consumption. In some embodiments, main control unit 770 includes a main state machine (not shown) configured to process and execute the parsed commands and to communicate with NVM 790.

In some embodiments, main control unit 770 is further configured to execute one or more circuit tests. In some embodiments, main control unit 770 includes electrical connections (not shown) to one or more circuits separate from tracking circuit 700 for executing the circuit tests. In some embodiments, main control unit 770 is further configured to power execution of one or more circuit tests using VDD. In some embodiments, main control unit 770 is further configured to execute one or more circuit tests to measure speed or power consumption.

Encoder/framer 780 is a circuit configured to encode frame data as digital signal Data Out. In some embodiments, encoder/framer 780 includes separate framer and encoder circuits (not shown).

NVM 790 is configured to store and retrieve data used by tracking circuit 700. In some embodiments, data stored in and retrieved from NVM 790 is test result data from one or more tests executed by main control unit 770.

Figure 8:
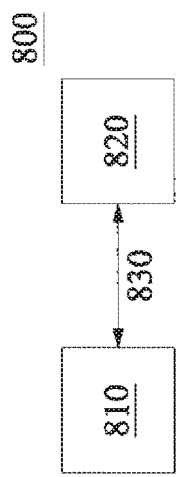
FIG. 8 is a schematic diagram of a wireless communication system, in accordance with some embodiments.

FIG. 8 is a schematic diagram of a wireless communication system 800, in accordance with some embodiments. Wireless communication system 800 includes a composite IC 810 and a wireless communication device 820 configured to communicate via an electromagnetic signal 830. In various embodiments, wireless communication system 800, composite IC 810, wireless communication device 820, and electromagnetic signal 830 are configured to communicate based on RFID, WiFi, 802.11, Bluetooth, ZigBee, NFC, or other wireless standards.

Composite IC 810 includes one or more WPDs configured to receive and transmit wireless signal 830. In some embodiments, composite IC 810 is composite IC 600 and the one or more WPDs is one or more WPDs 640 of composite IC 600. In some embodiments, composite IC is a 3DIC stacking described above with respect to FIG. 5(*a*), 5(*b*), 5(*c*), or 5(*d*).

Wireless communication device 820 is a communication device configured to communicate wirelessly. In some embodiments, wireless communication device 820 is a wireless tracking device. In some embodiments, wireless communication device 820 is a handy reader described above with respect to FIG. 1.

In some embodiments, wireless communication device 820 is electrically connected to one or more storage devices (not shown) and is further configured to store data retrieved from composite IC 810 via electromagnetic signal 830 in the one or more storage devices. In some embodiments, wireless communication device 820 is electrically connected to one or more storage devices (not shown) and is further configured to transmit data or commands from the one or more storage devices to composite IC 810 via electromagnetic signal 830.

Figure 9:
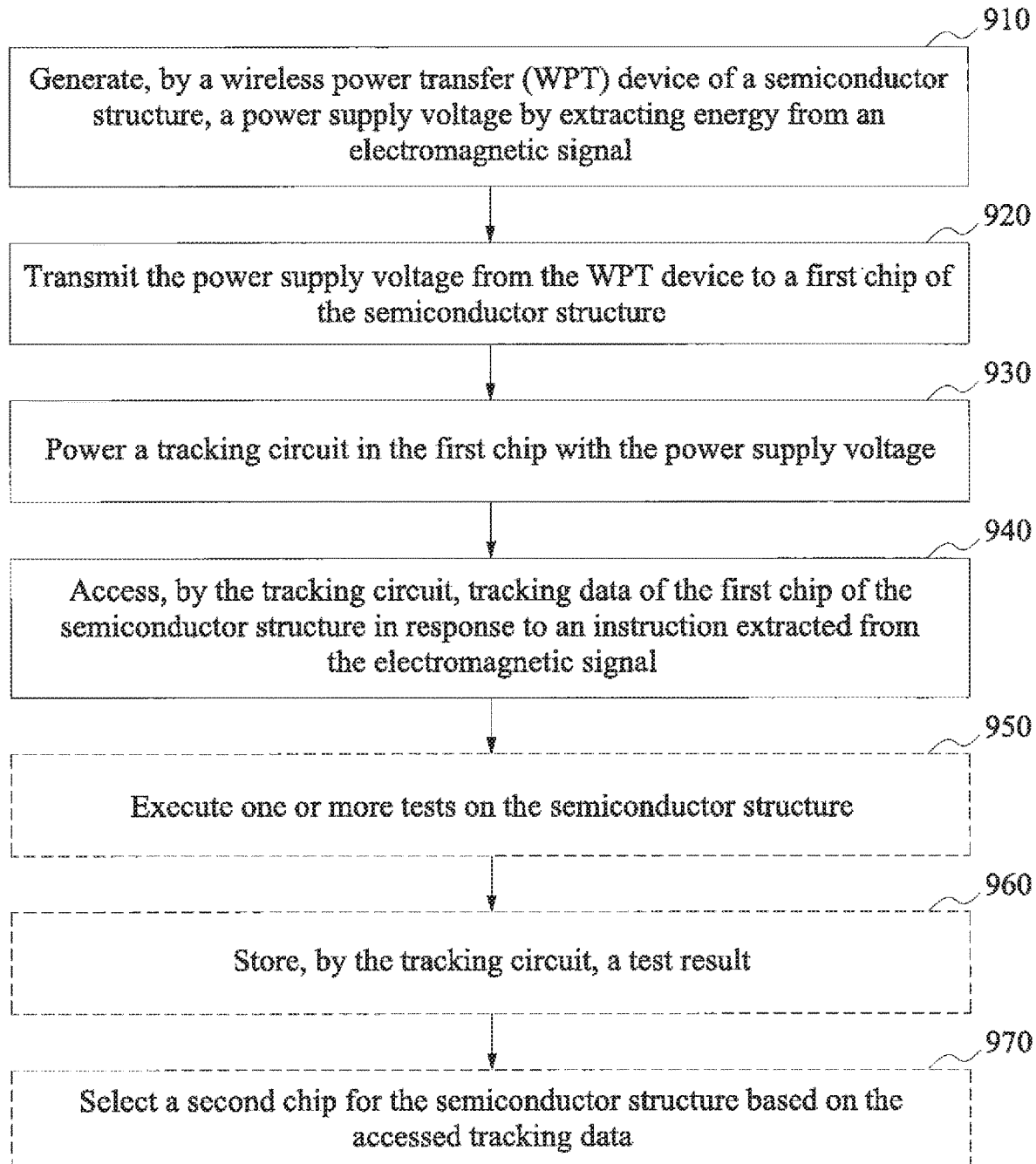
FIG. 9 is a flow chart of a method of accessing a semiconductor structure, in accordance with some embodiments.

FIG. 9 is a flow chart of a method 900 of accessing a semiconductor structure, in accordance with some embodiments. Method 900 is usable in conjunction with a wireless communication system, e.g., wireless communication system 800. In some embodiments, the semiconductor structure is a composite IC, e.g., composite IC 600.

Method 900 includes operation 910, in which a WPT device of a semiconductor structure generates a power supply voltage by extracting energy from an electromagnetic signal. In some embodiments, the WPT device is part of a WPD 640 of composite IC 600. In some embodiments, the electromagnetic signal is electromagnetic signal 830 of wireless communication system 800.

Method 900 continues at operation 920, in which the power supply voltage is transmitted from the WPT device to a tracking circuit in a first chip of the semiconductor structure by an interconnection structure of the semiconductor structure. In some embodiments, the tracking circuit is a tracking circuit 650 of composite IC 600. In some embodiments, the tracking circuit is a tracking circuit 700.

In some embodiments, the power supply voltage is transmitted by an interconnection structure of interconnection structures 660 of composite IC 600. In some embodiments, the power supply voltage is transmitted from a second chip of the semiconductor structure. In some embodiments, the WPT device is in a first circuit layer of the semiconductor structure, the first chip is in a second circuit layer of the semiconductor structure, and the power supply voltage is transmitted from the first circuit layer of the semiconductor structure to the second circuit layer of the semiconductor structure.

Method 900 continues at operation 930, in which the tracking circuit is powered with the power supply voltage from the WPT device. In some embodiments, the tracking circuit is powered using a front end circuit 710 of tracking circuit 700.

Method 900 continues at operation 940, in which the tracking circuit accesses tracking data of the first chip of the composite IC in response to an instruction extracted from the electromagnetic signal. In some embodiments, the tracking data are accessed from a memory circuit in the tracking circuit. In some embodiments, the tracking data are accessed from an NVM 790.

In some embodiments, the tracking data are data related to chip or IC identification (ID), origin, performance, function, or test results. In some embodiments, accessing tracking data includes outputting the tracking data from the tracking circuit to the WPT device. In some embodiments, the tracking circuit accesses tracking data using digital controller 750 of tracking circuit 700.

In some embodiments, method 900 includes operations in addition to operations 910 through 940 for accessing tracking data. In various embodiments, additional operations include execution of one or more tests on the semiconductor device in which one or more tracking devices are located, and storing tracking data including test results of the one or more tests.

In some embodiments, method 900 continues at operation 950, in which one or more tests are executed on the semiconductor structure. In some embodiments, executing the one or more tests includes outputting a test result from the tracking circuit to the WPT device. In some embodiments, at least one of the one or more tests is executed within the chip or IC in which the WPT device is located. In some embodiments, at least one of the one or more tests is executed outside the chip or IC in which the WPT device is located and within the semiconductor structure.

In some embodiments, the one or more tests include determining a speed of a circuit. In some embodiments, the one or more tests include determining a power consumption of a circuit. In some embodiments, the tracking circuit executes the one or more tests using digital controller 750 of tracking circuit 700.

In some embodiments, a first test of the one or more tests is performed by a first tracking circuit and a second test of the one or more tests is performed by a second tracking circuit separate from the first tracking circuit. In some embodiments, the first tracking circuit and the second tracking circuit are on the first chip. In some embodiments, the first tracking circuit is on the first chip and the second tracking circuit is on a second chip.

In some embodiments, method 900 continues at operation 960, in which a test result is stored by the tracking circuit. In some embodiments, the test result is stored in a memory circuit in the tracking circuit. In some embodiments, the test result is stored in an NVM 790. In some embodiments, the test result is the result of a test prior to execution of method 900. In some embodiments, the test result is the result of a test performed in operation 950 of method 900.

In some embodiments, method 900 includes additional operations in which accessed tracking data are used for making decisions related to assembling a semiconductor structure. In various embodiments, accessed tracking data are used for matching characteristics of chips added to a semiconductor structure to characteristics of chips already present in the semiconductor structure.

In some embodiments, method 900 continues at operation 970, in which a second chip is selected for the semiconductor structure based on the accessed tracking data. In various embodiments, the second chip is selected based on the accessed tracking data comprising one or more of an IC or chip ID, origin, performance, function, or result of one or more tests. In some embodiments, the second chip is selected based on accessed tracking data comprising a result of a test performed in operation 950 of method 900. In some embodiments, the second chip is selected based on accessed tracking data comprising results of more than one test performed in accordance with operation 950 of method 900.

In some embodiments, the second chip is selected based on circuit speed information contained in the accessed tracking data. In some embodiments, the second chip is selected based on circuit power consumption information contained in the accessed tracking data. In some embodiments, the second chip is selected based on binning information contained in the accessed tracking data.

In some embodiments, the second chip is a chip in a chip package. In some embodiments, the second chip is a chip of a plurality of chips, each of which is selected based on accessed tracking data.

In some embodiments, a composite IC comprises a first circuit layer, a second circuit layer comprising a first chip and a second chip, and a first WPT device in the first chip or the first circuit layer. The first WPT device is configured to generate a power supply voltage by extracting energy from an electromagnetic signal. A first tracking circuit in the second chip or the first circuit layer is configured to be powered by the power supply voltage from the first WPT device and to store or output tracking data in response to an instruction extracted from the electromagnetic signal.

In some embodiments, a method of accessing a composite IC comprises generating, by a WPT device of the composite IC, a power supply voltage by extracting energy from an electromagnetic signal, transmitting the power supply voltage from the WPT device to a first chip of the composite IC, and powering a tracking circuit in the first chip is with the power supply voltage. The method further comprises accessing, by the tracking circuit, tracking data of the first chip of the composite IC in response to an instruction extracted from the electromagnetic signal.

In some embodiments, a method of testing a semiconductor structure comprises causing a WPT device of the semiconductor structure to generate a power supply voltage by extracting energy from an electromagnetic signal and causing, by using a tracking circuit embedded in a first chip of the semiconductor structure, the semiconductor structure to execute a test of the semiconductor structure, the test being powered by the power supply voltage from the WPT device. The WPT device is embedded in a portion of the semiconductor structure other than the first chip of the semiconductor structure.

While the disclosure has been described in terms of what are presently considered to be the most practical and preferred embodiments, it is to be understood that the disclosure need not be limited to the disclosed embodiment. On the contrary, it is intended to cover various modifications and similar arrangements included within the spirit and scope of the appended claims, which are to be accorded with the broadest interpretation so as to encompass all such modifications and similar structures. Therefore, the above description and illustration should not be taken as limiting the scope of the present disclosure which is defined by the appended claims.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) comprising:
   a wireless power transfer (WPT) device configured to extract energy from an electromagnetic signal and provide an output voltage; and
   a tracking circuit disposed on a substrate adjacent to the WPT device and configured to be powered by the output voltage of the WPT device, the tracking circuit configured to extract an instruction from the electromagnetic signal of the WPT device.

2. The integrated circuit of claim 1, comprising a first chip electrically connected to the WPT device.

3. The integrated circuit of claim 2, wherein the WPT device and the first chip are in a same circuit layer.

4. The integrated circuit of claim 2, wherein the WPT device and the tracking circuit are disposed in the first chip.

5. The integrated circuit of claim 2, further comprising a second chip, wherein the tracking circuit is disposed in the second chip and the WPT device is disposed in the first chip.

6. The integrated circuit of claim 2, wherein the first chip is disposed over the substrate adjacent to the WPT device, wherein the tracking circuit is disposed in the first chip.

7. The integrated circuit of claim 2, further comprising a second tracking circuit configured to be powered by the output voltage of the WPT device and to access data, and wherein the second tracking circuit is disposed in the first chip.

8. The integrated circuit of claim 1, wherein the instruction extracted by the tracking circuit includes at least one of chip identification, circuit speed, and power consumption.

9. An integrated circuit (IC) comprising:
a wireless power transfer (WPT) device configured to convert electromagnetic radiation into electrical power; and
a chip disposed on a substrate adjacent to the WPT device, the chip comprising a tracking circuit configured to be powered by the electrical power of the WPT device, the tracking circuit further configured to extract an instruction from an electronic signal of the WPT device and perform a function in response to the instruction.

10. The integrated circuit of claim 9, wherein the function includes reading data stored in the tracking circuit, wherein the data is selected from the group consisting of chip identification, circuit speed, and power consumption.

11. The integrated circuit of claim 9, wherein the function includes writing data to a memory in the tracking circuit, wherein the data is selected from the group consisting of chip identification, circuit speed, and power consumption.

12. The integrated circuit of claim 9, wherein the function includes performing a circuit test related to a speed of a circuit.

13. The integrated circuit of claim 9, wherein the function includes performing a circuit test related to an amount of power consumed by a circuit.

14. The integrated circuit of claim 9, further comprising:
a second WPT device configured to convert electromagnetic radiation into electrical power;
a second chip electrically connected to the second WPT device; and
a second tracking circuit disposed in the second chip, the second tracking circuit configured to be powered by the electrical power of the second WPT device and to perform a second function in response to an instruction included in the electromagnetic radiation.

15. A method comprising:
converting, with a wireless power transfer (WPT) device, electromagnetic radiation into electrical power;
powering a tracking circuit adjacent to the WPT device with the electrical power;
extracting, with the tracking circuit, an instruction from an electronic signal of the WPT device; and
performing a function in response to the instruction.

16. The method of claim 15, wherein the response to the instruction is extracted from the electromagnetic radiation.

17. The method of claim 15, wherein performing the function includes determining a speed of the tracking circuit.

18. The method of claim 15, wherein performing the function includes determining a power consumption of the tracking circuit.

19. The method of claim 15, further comprising selecting a first chip based on the performing of the function.

20. The method of claim 15, further comprising:
powering another tracking circuit in a first chip with the electrical power; and
performing a second function.

* * * * *